United States Patent
Gao et al.

(10) Patent No.: US 7,718,449 B2
(45) Date of Patent: May 18, 2010

(54) WAFER LEVEL PACKAGE FOR VERY SMALL FOOTPRINT AND LOW PROFILE WHITE LED DEVICES

(75) Inventors: Xiang Gao, Edison, NJ (US); Michael Sackrison, Bethlehem, PA (US)

(73) Assignee: Lumination LLC, Cleveland, OH (US)

(*) Notice: Subject to any disclaimer, the term of this patent is extended or adjusted under 35 U.S.C. 154(b) by 338 days.

(21) Appl. No.: 11/588,551

(22) Filed: Oct. 27, 2006

(65) Prior Publication Data

US 2007/0202623 A1 Aug. 30, 2007

Related U.S. Application Data

(60) Provisional application No. 60/731,078, filed on Oct. 28, 2005.

(51) Int. Cl.
*H01L 21/00* (2006.01)
(52) U.S. Cl. .................. 438/21; 438/22; 438/29; 438/108; 438/381; 257/E25.02; 257/E33.061
(58) Field of Classification Search ............. 438/21, 438/22, 29, 108, 381; 257/E25.02, E33.061
See application file for complete search history.

(56) References Cited

U.S. PATENT DOCUMENTS

| | | | |
|---|---|---|---|
| 5,376,580 A | 12/1994 | Kish et al. | |
| 6,071,795 A | 6/2000 | Cheung et al. | |
| 6,964,877 B2 | 11/2005 | Chen et al. | |
| 2004/0188696 A1* | 9/2004 | Hsing Chen et al. | 257/99 |
| 2004/0203189 A1* | 10/2004 | Chen et al. | 438/108 |
| 2004/0211972 A1 | 10/2004 | Du et al. | |
| 2005/0023550 A1 | 2/2005 | Eliashevich et al. | |
| 2006/0124939 A1* | 6/2006 | Lee et al. | 257/79 |
| 2006/0124941 A1* | 6/2006 | Lee et al. | 257/88 |
| 2006/0240585 A1* | 10/2006 | Epler et al. | 438/22 |
| 2007/0018184 A1* | 1/2007 | Beeson et al. | 257/98 |

FOREIGN PATENT DOCUMENTS

WO  WO 2005/008740  1/2005

OTHER PUBLICATIONS

Miskys et al., "Freestanding GaN-substrates and devices," WILEY-VCH Verlag GmbH & Co. KGaA, 2003.

* cited by examiner

*Primary Examiner*—Alexander G Ghyka
*Assistant Examiner*—Abdulfattah Mustapha
(74) *Attorney, Agent, or Firm*—Fay Sharpe LLP

(57) ABSTRACT

A surface mount LED package having a tight footprint and small vertical image size is fabricated by a method comprising: forming light emitting diode chips each having a substrate and a plurality of layers configured to emit electroluminescence responsive to electrical energizing; forming electrical vias in a sub mount, the electrical vias passing from a front side of the sub-mount to a back-side of the sub-mount; flip chip bonding the light emitting diode chips on the front-side of the sub mount such that each light emitting diode chip electrically contacts selected electrical vias; thinning or removing the substrates of the flip-chip bonded light emitting diode chips; and after the thinning, disposing a phosphor over the flip chip bonded light emitting diode chips.

17 Claims, 3 Drawing Sheets

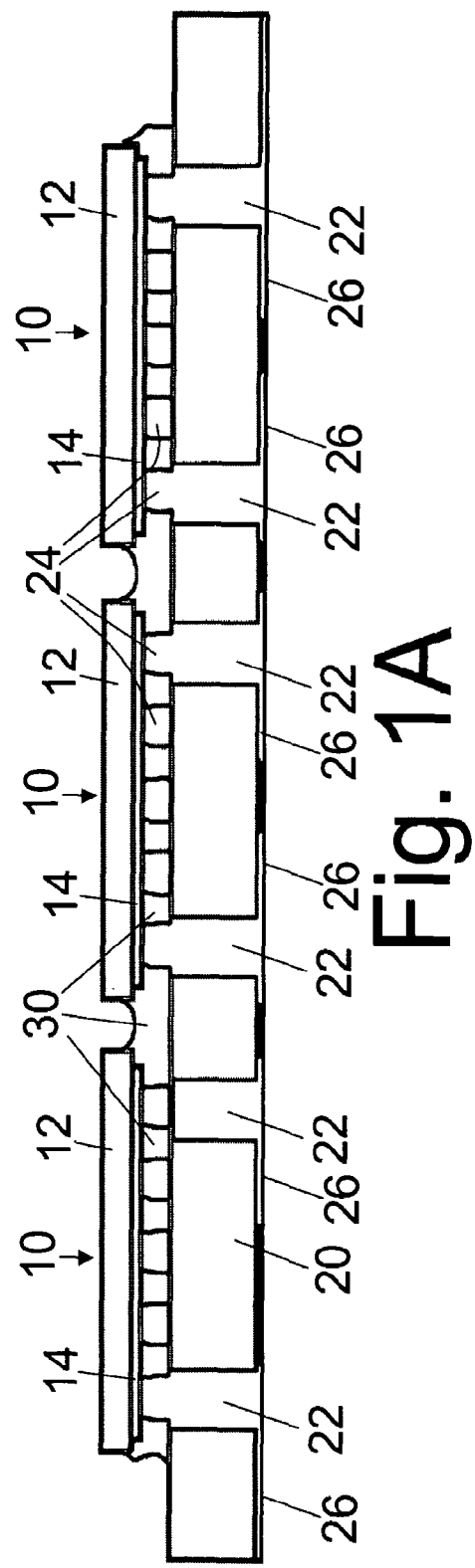
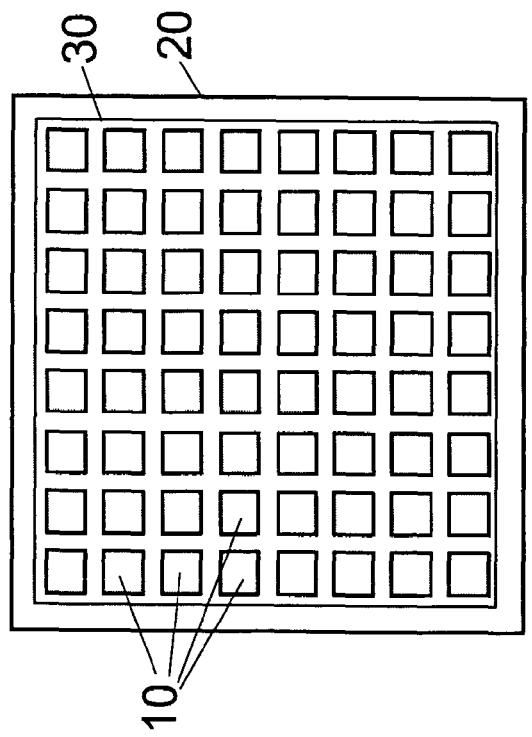

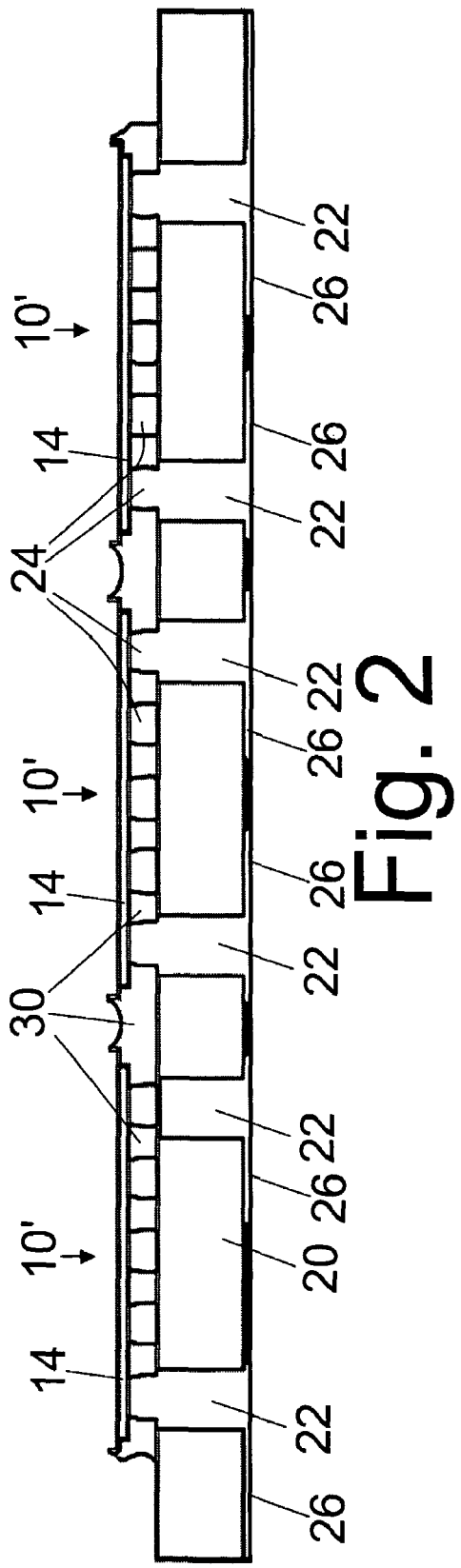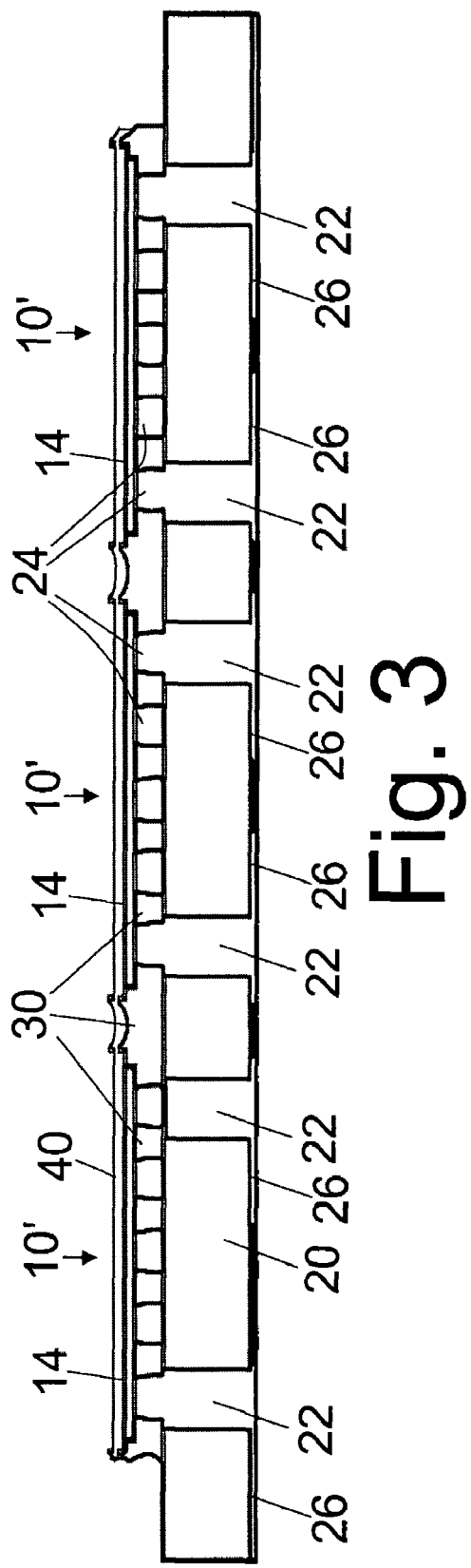

WAFER LEVEL PACKAGE FOR VERY SMALL FOOTPRINT AND LOW PROFILE WHITE LED DEVICES

This application claims the benefit of U.S. Provisional Application No. 60/731,078 filed Oct. 28, 2005. U.S. Provisional Application No. 60/731,078 is incorporated by reference herein in its entirety.

BACKGROUND

Tight footprint white light emitting diode (LED) packages usually include at least one conformal coating of phosphor applied on the LED chips. However, the vertical emission profile of the light source is limited by the height of the chip substrate. Also due to the side emission of the substrate, the phosphor is advantageously coated on the vertical sidewall to capture all the light. Phosphor coating on the sidewall can result in poor goniometric color uniformity due to phosphor thickness non-uniformity. Another disadvantage of a conformally coated small light source is heat-induced degradation of the host material for the phosphor layer, due to the fact that the phosphor blend is close to the chip and absorbs more radiometric power per unit area and in turn generate more heat per unit area. However, heat dissipation of the phosphor layer is poor due to lack of heat conduction.

To address these problems, it is known to use a light emitting package that employs a plurality of light emitting diode chips. Using several chips provides higher light output, and if the colors of the chips are suitably selected (for example, by selecting red, green, and blue chips or a similar combination of saturated colors) the light output can approximate white light. Alternatively, it is known to employ light emitting diode chips that emit in the blue, violet, or ultraviolet range, and to coat such chips with a suitable phosphor blend to approximate white light. The output can be substantially completely converted light (e.g., ~100% conversion efficiency with the phosphor producing approximately white light) or can be a blend of direct chip emission and converted phosphor emission (e.g., blue direct chip emission and yellowish converted phosphor emission that blend to approximate white light).

In addition, yield of wafer level substrate lift off is very low due to epitaxial layer cracking after lift-off. The yield is expected to be worse when larger size substrates are used.

BRIEF SUMMARY

In some non-limiting aspects of certain embodiments, a small footprint and low profile white lateral flip-chip LED package has the substrate of the LED chip removed and coated with a conforming layer of phosphor or phosphor blend. Devices of this type are fabricated by wafer level packaging, where many LED chips are bonded to a submount with a relatively small distance between them for separation purposes. Underfill materials are disposed under the chips before or after die bonding. The substrate of each individual device is removed at the submount wafer level. Also at submount wafer level in a submount wafer level process. A phosphor layer is disposed over the LED chips, followed by a separation process to separate individual white LED packages. These devices are ready to be used as point source.

In such a package, the thickness of the LED chip after substrate removal is very thin (typically less than 5 microns) relative to its lateral dimension. Therefore, side emission of light is minimal, and the phosphor coating is suitably optionally limited to the tops of the LED chips. The phosphor layer is optionally supported by the chip and underfill outside the chips without coating the submount. Alternatively, the phosphor can coat both the LED chips and the laterally intervening submount areas. By bonding individual chips close together and supporting them by underfill material, the host submount can be used for thin film process at wafer level, and the wafer size is scalable. Some non limiting advantages of this package include: (i) low profile light emitting source in both lateral and vertical directions—high lumen per unit area; (ii) suitable for high volume process; (iii) reduces cost of submount; (iv) provides enhanced color uniformity; (v) provides for direct heat dissipation of phosphor layer from thermally conductive LED epitaxial layer after substrate removal; and (vi) capable of applying thin film process for laser lift off chips at wafer level with scalability, high throughput and high yield.

It will be appreciated that any given embodiment may include none, one, some, or all of these advantages.

BRIEF DESCRIPTION OF THE DRAWINGS

The invention may take form in various components and arrangements of components, and in various process operations and arrangements of process operations. The drawings are only for purposes of illustrating example embodiments and are not to be construed as limiting.

FIGS. 1A and 1B diagrammatically show side and top views, respectively, of a light emitting devices wafer at a first stage of fabrication.

FIG. 2 diagrammatically shows a side view of the light emitting devices wafer of FIGS. 1A and 1B at a point further along the fabrication.

FIG. 3 diagrammatically shows a side view of the light emitting devices wafer of FIG. 2 at a point still further along the fabrication.

DETAILED DESCRIPTION OF PREFERRED EMBODIMENTS

Figure 4B:
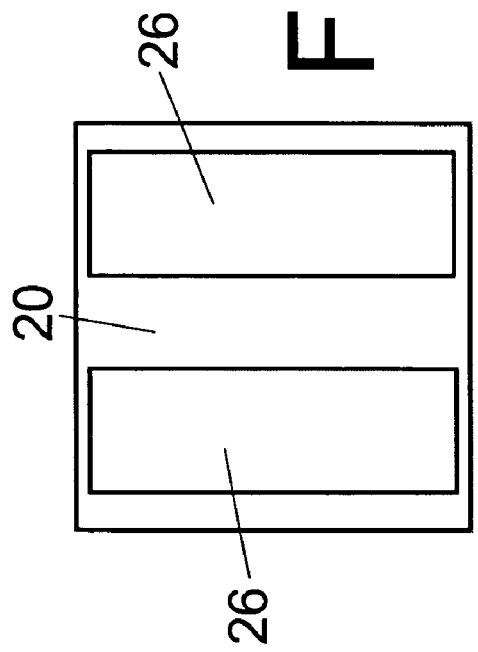
FIGS. 4A, 4B, and 4C diagrammatically show side, top, and bottom views, respectively, of a light emitting chip separated from the light emitting devices wafer of FIG. 3.

With reference to the FIGURES, an example fabrication process is set forth. Lateral flip chip LED chips 10 each including a substrate 12 and device layers 14 are bonded on a submount 20 with via connection 22 to the bottom of the submount 20 for electrical interconnection. In some embodiments, the light emitting diode chips 10 are group III nitride-based light emitting diode chips in which the device layers 14 are predominantly or entirely made up of layers of group III-nitride materials (such as GaN, AlN, InN, or binary or ternary alloys of these) and the substrate 12 is made of sapphire, SiC, GaN, or another suitable substrate for epitaxial growth of group III-nitride layers. The submount 20 is suitably made of an electrically insulating material such as alumina, semi-insulating silicon, BeO, AlN, or so forth, or of electrically insulating composites such as AlSiC, graphite-filled polymers, or so forth. Some suitable methods for forming the submount 20 with electrically conductive vias 22 are disclosed in Hsing Chen et al., U.S. Publ. Appl. 2004/0188696 A1 published Sep. 30, 2004. Hsing Chen et al., U.S. Publ. Appl. 2004/0188696 A1 is incorporated herein by reference in its entirety. The lateral flip-chip LED chips 10 are suitably bonded by bonding bumps 24 disposed on frontside ends of the conductive vias 22 or on printed circuitry (not shown) that electrically communicates with the vias 22. Backside ends of the conductive vias 22 electrically communicate with solderable contact pads 26 which are suitable for soldering the LED package to a printed circuit board or other support as a surface mount LED package. Electrical power applied to the contact pads 26 is conducted by the vias 22 and the bonding bumps 24 to electrodes (not shown) of the LED chips 10. This forms a chip-on-submount assembly.

Optionally, underfill material 30 is incorporated into the chip-on-submount assembly at the submount wafer level. Optionally, the underfill material 30 may include a phosphor or phosphor blend such as the same type of phosphor to be coated later on the top, or a different phosphor or phosphor blend. The bonding and underfilling operations can be performed in any order. That is, the bonding can be performed first, followed by application of the underfill, or the underfill can be applied first.

FIGS. 1A and 1B diagrammatically show side and top views, respectively, of the chip-on-submount assembly after bonding and underfilling (or, alternatively, underfilling and bonding).

After the flip chip bonding, the substrates 12 are lifted-off of individual LED chips 10 by a substrate removal process, such as optical or laser lift-off, to form modified LED chips 10' that are modified in that the substrates 12 are removed. Some suitable laser lift-off techniques for GaN grown on a sapphire substrate are disclosed in Cheung et al., U.S. Pat. No. 6,071,795. Cheung et al., U.S. Pat. No. 6,071,795 is incorporated by reference herein in its entirety. For example, the two-step lift-off process disclosed in the "Detailed Description" of Cheung et al. may be used, in which a first laser exposure process weakens the bond between the epitaxial layers 14 and the substrate 12, followed by a second, separate detachment process, such as heating or exposure to ultrasonic energy, that effectuates the actual separation of the substrate 12. Alternatively, the single-step laser lift-off process of Kelly et al. discussed in the background of Cheung et al. may be used. In this single-step process the laser exposure alone is of high enough intensity and duration to detach the substrate 12.

Although not indicated in the drawings, post-lift-off surface processing of the epitaxial layers 14 is optionally performed. For example, the LED epitaxial layers 14 exposed by the substrate lift-off are optionally roughened, or a photonic crystal structure optionally deposited, or other post-substrate liftoff processing is optionally applied to enhance light extraction. In some embodiments, an anti-reflective layer or a filter layer (not shown) is disposed on top of the roughed surface. The total thickness of this layer is in some embodiments less than about 200 nanometers.

In some alternative embodiments (not illustrated), the substrate may be thinned but not completely removed. For example, the substrate can be thinned using mechanical lapping, mechanical polishing, mechanical grinding, or the like, or can be thinned using a suitable wet or dry chemical etching, or so forth. The substrate is preferably thinned sufficiently so that lateral light emission does not produce poor goniometric color uniformity. For example, it may be sufficient to thin the substrate to a thickness that does not support substantial lateral waveguiding of the direct or converted light.

FIG. 2 diagrammatically shows a side view of the chip-on-submount assembly after the substrate lift-off.

After the substrate removal or thinning process, a phosphor or phosphor blend 40 is deposited on top of the sub-mount wafer 20. The phosphor 40 can be deposited over the entire wafer 20 or selectively deposited on each LED chip 10' in the area slightly larger than (for example, less than 20 microns larger than) the LED chip 10', on the top of the chips 10' and underfill material 30. Some suitable phosphor or phosphor blend deposition methods include but are not limited to: spray coating; spin on coating; molding; dispensing; and physical vapor deposition of pure phosphor. Optionally, an anti-reflective layer (not shown) is deposited on top of the phosphor layer to facilitate light extraction.

FIG. 3 diagrammatically shows a side view of the chip-on-submount assembly after deposition of the phosphor or phosphor blend 40.

Figure 4C:
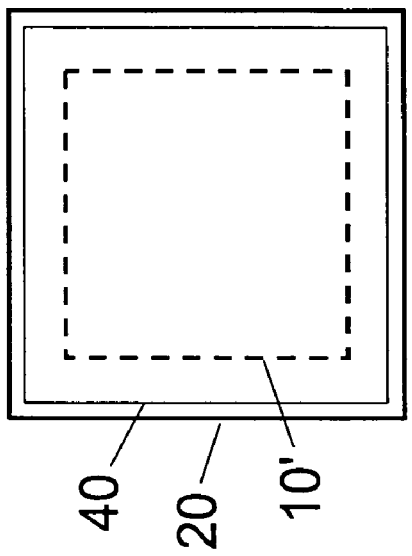
Figure 4A:
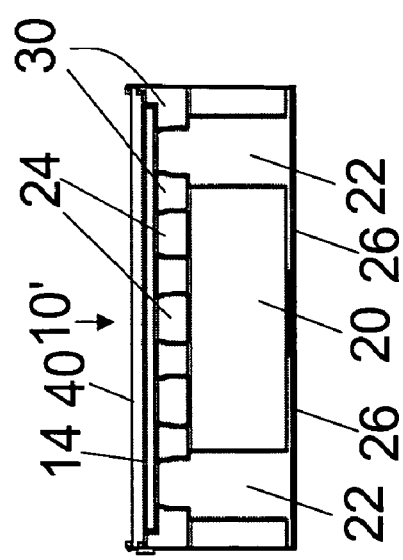

With reference to FIGS. 4A, 4B, and 4C, a small white LED source can be obtained by separating the finished submount. Some suitable separation methods include but are not limited to saw-cutting, laser separation, or so forth. The final products are surface mount white LED packages, one such surface mount white LED package 50 being diagrammatically shown in side, top, and bottom view in respective FIGS. 4A, 4B, and 4C. In FIG. 4B, the LED chip 10' disposed beneath the phosphor or phosphor blend 40 is denoted by a dashed square 10'. It will be appreciated that in the top view this LED chip 10' may be wholly visible, partially visible, or completely visually obscured by the overlying phosphor or phosphor blend 40, depending upon the degree of transparency or opacity of the phosphor or phosphor-blend 40. The surface mount white LED package 50 has a tight footprint and small vertical image size.

In actually performed experiments, the inventors have performed spray coating on laser lift-off devices. Wafer level bonding and lift-off have been successful with yield close to 90%.

While described with example reference to white LED embodiments, it will be appreciated that the foregoing is applicable to LED packages having light output that is white or colored. For example, the foregoing is applicable to an LED package including a UV LED with a green phosphor. The foregoing is also applicable both to LED packages in which the light output is entirely converted light produced by the phosphor and to LED packages in which the light output is a combination or blending of direct electroluminescence from the LED and converted light output by the phosphor. For example, the foregoing is applicable to an LED package having a UV LED and a phosphor that produces white light, and is also applicable to an LED package having a violet or blue LED and a yellowish phosphor such that the direct blue light and converted yellowish light produce a blended white light output.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method for fabricating a light emitting diode package, the method comprising:

forming light emitting diode chips each having a substrate and a plurality of layers configured to emit electroluminescence responsive to electrical energizing;

forming electrical vias in a sub mount, the electrical vias passing from a front-side of the sub-mount to a back-side of the sub-mount;

flip chip bonding the light emitting diode chips on the front-side of the sub-mount such that each light emitting diode chip electrically contacts selected electrical vias;

thinning or removing the substrates of the flip-chip bonded light emitting diode chips; and after the thinning, disposing a phosphor over the flip chip bonded light emitting diode chips.

2. The method as set forth in claim 1, further comprising:

after the disposing of the phosphor, separating the submount to form surface mount light emitting diode packages.

3. The method as set forth in claim 1, further comprising:

disposing an underfill material between the front-side of the sub-mount and the light emitting diode chips.

4. The method as set forth in claim 3, wherein the underfill material is disposed before flip-chip bonding.

5. The method as set forth in claim 3, wherein the underfill material is disposed after the flip-chip bonding.

6. A method for fabricating a light emitting diode package, the method comprising:
- forming light emitting diode chips each having a substrate and a plurality of layers configured to emit electroluminescence responsive to electrical energizing;
- forming electrical vias in a sub-mount, the electrical vias passing from a front-side of the sub-mount to a backside of the sub-mount;
- flip chip bonding the light emitting diode chips on the front-side of the sub-mount such that each light emitting diode chip electrically contacts selected electrical vias;
- removing the substrates of the flip-chip bonded light emitting diode chips; and
- after the removing of the substrates, disposing a phosphor over the flip chip bonded light emitting diode chips.

7. The method as set forth in claim 6, wherein the removing comprises removing the substrate by an optical lift-off process.

8. The method as set forth in claim 6, wherein the removing comprises removing the substrate by a laser lift-off process.

9. The method as set forth in any one of claims 8, wherein the light emitting diode chips are group III nitride-based light emitting diode chips.

10. The method as set forth in claim 9, wherein the light emitting diode chips emit UV light and the disposing of a phosphor comprises disposing a phosphor that produces substantially white converted light.

11. The method as set forth in claim 9, wherein the light emitting diode chips emit violet or blue light and the disposing of a phosphor comprises disposing a phosphor that produces substantially yellowish converted light that blends with the violet or blue light to output substantially white light.

12. The method as set forth in claim 1, wherein the disposing of a phosphor comprises disposing a phosphor over substantially the entire frontside of the submount including the light emitting diode chips.

13. The method as set forth in claim 1, wherein the disposing of a phosphor comprises disposing a phosphor over the light emitting diode chips without substantial disposing onto exposed areas of the frontside of the submount.

14. The method as set forth in claim 13, wherein the disposing of a phosphor comprises disposing the phosphor over each light emitting diode chip in an area including the light emitting diode chip that is less than 20 microns larger than the light emitting diode chip.

15. A method for fabricating a light emitting diode package, the method comprising:
- forming light emitting diode chips each having a substrate and a plurality of layers configured to emit electroluminescence responsive to electrical energizing;
- forming electrical vias in a sub-mount, the electrical vias passing from a front-side of the sub-mount to a backside of the sub-mount;
- flip chip bonding the light emitting diode chips on the front-side of the sub-mount such that each light emitting diode chip electrically contacts selected electrical vias;
- thinning or removing the substrates of the flip-chip bonded light emitting diode chips wherein the light emitting diode chips after thinning or removal of the substrate have thicknesses of less than 5 microns; and
- after the thinning, disposing a phosphor over the flip chip bonded light emitting diode chips.

16. The method as set forth in claim 1, wherein the disposing a phosphor comprises:
- selectively deposited the phosphor in areas each encompassing and slightly larger than one of the light emitting diode chips.

17. The method as set forth in claim 16, wherein the areas of selective phosphor deposition each extend less than 20 microns larger than the light emitting diode chip.

* * * * *